(12) United States Patent
Cao et al.

(10) Patent No.: US 6,229,191 B1
(45) Date of Patent: May 8, 2001

(54) CONDUCTIVE GUARD RINGS FOR ELEVATED ACTIVE PIXEL SENSORS

(75) Inventors: Min Cao, Mountain View; Wayne M. Greene, Los Gatos; Dietrich W. Vook, Menlo Park, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/443,960

(22) Filed: Nov. 19, 1999

(51) Int. Cl.$^7$ ............... H01L 31/0376; H01L 31/0226; H01L 31/075; H01L 31/0232
(52) U.S. Cl. ................ 257/444; 257/53; 257/226; 257/448; 257/458
(58) Field of Search ................ 257/53, 226, 444, 257/448, 458

(56) References Cited

U.S. PATENT DOCUMENTS

| | | | |
|---|---|---|---|
| 5,936,261 | * 8/1999 | Ma et al. | 257/226 |
| 6,018,187 | * 1/2000 | Theil et al. | 257/458 |
| 6,051,867 | * 4/2000 | Theil et al. | 257/444 |

* cited by examiner

Primary Examiner—Gene M. Munson
(74) Attorney, Agent, or Firm—Brian R. Short (57) ABSTRACT

An array of active pixel sensors. The array of active pixel sensors includes a substrate that includes electronic circuitry. An interconnect structure is formed adjacent to the substrate. The interconnect structure includes a plurality of conductive vias. A plurality of conductive guard rings are formed adjacent to the interconnect structure. Each conductive guard ring is electrically connected to the substrate through at least one of the conductive vias. A plurality of photo diode sensors are formed adjacent to the interconnect structure. Each photo diode sensor is surrounded by at least one of the conductive guard rings. Each photo diode sensor includes a pixel electrode. The pixel electrode is electrically connected to the substrate through a corresponding conductive via. An I-layer is formed adjacent to the pixel electrode. The array of active pixel sensors further includes a transparent conductive layer formed adjacent to the photo diode sensors. An inner surface of the conductive layer is physically connected to the photo diode sensors, and electrically connected to the substrate through a conductive via. The electronic circuitry biases the photo diode sensors and controls a guard voltage potential of the conductive guard rings.

15 Claims, 5 Drawing Sheets

CONDUCTIVE GUARD RINGS FOR ELEVATED ACTIVE PIXEL SENSORS

FIELD OF INVENTION

This invention relates generally to photo diode active pixel sensors. In particular, it relates to voltage biased conductive guard rings which surround the photo diode active pixel sensors.

BACKGROUND

An array of image sensors or active pixel sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allow s electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems. An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

Figure 1:
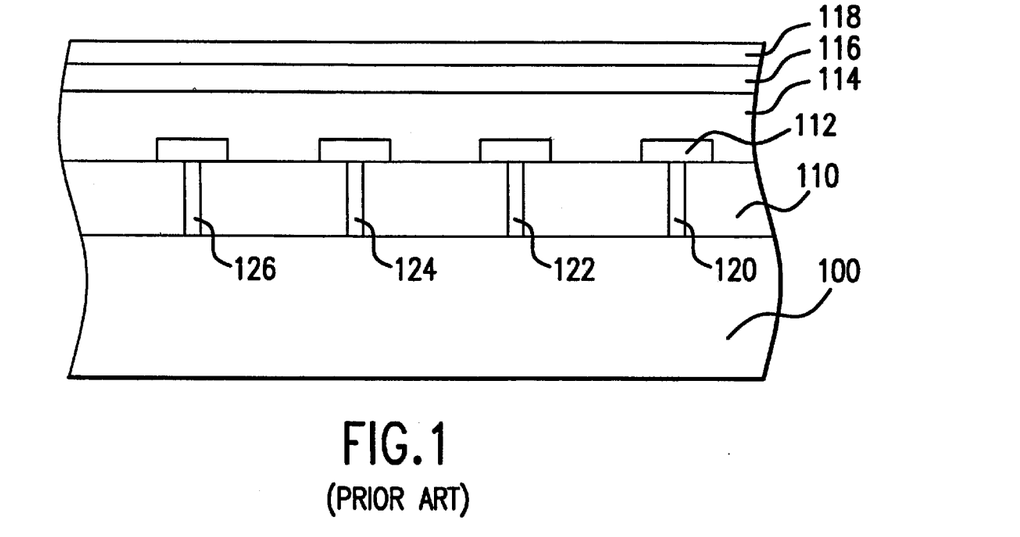
FIG. 1 shows a cross-section of a prior art array of photo diode sensors.

FIG. 1 shows a cross-section of a prior art array of image sensors. This array of image sensors includes elevated photo diode sensors located over a substrate 100. An interconnection structure 110 electrically connects an N-layer 112 of the photo diode sensors to the substrate 100. An I-layer 114 is formed over the N-layer 112. A P-layer 116 is formed over the I-layer 114. The P-layer 116, the I-layer 114 and the N-layer 112 form the array of photo diode sensors. Conductive vias 120, 122, 124, 126 electrically connect anodes of a first photo diode sensor, a second photo diode sensor, a third photo diode sensor and a fourth photo diode sensor to the substrate 100. A transparent conductive layer 118 is located over the array of photo diode sensors, and electrically connects cathodes of the first photo diode sensor, the second photo diode sensor, the third photo diode sensor and the fourth photo diode sensor to the substrate 100.

The photo diode sensors conduct charge when the photo diode sensors receive light. The substrate 100 generally includes sense circuitry and signal processing circuitry. The sense circuitry senses how much charge the photo diode sensors have conducted. The amount of charge conducted represents the intensity of light received by the pixel sensors.

Figure 2:
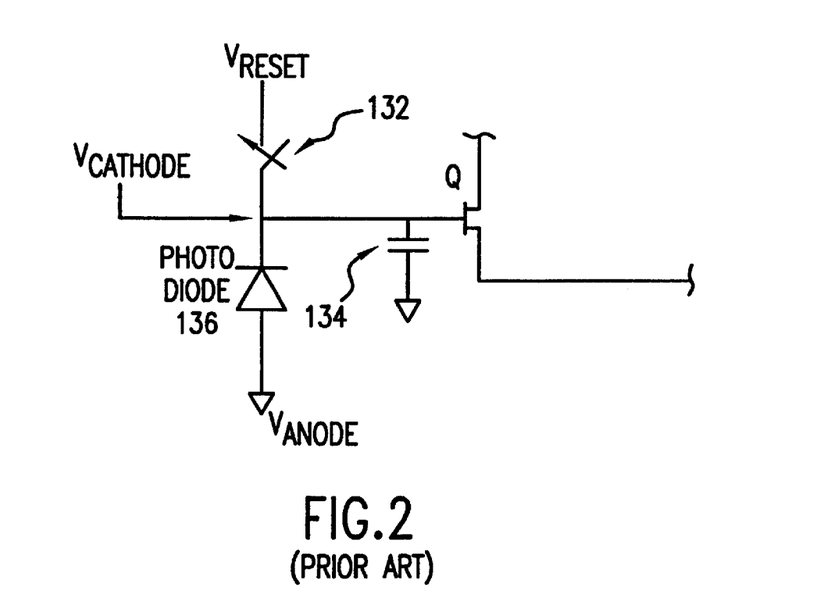
FIG. 2 shows a typical circuit which is connected to a cathode of each of the photo diode sensor of the array of photo diode sensors.

FIG. 2 is a schematic of a typical circuit included on the substrate 100 which is electrically connected to each photo diode sensor 136. The circuit includes a switch 132 which drives the cathode of each photo diode sensor 136 to an initial cathode voltage and charges a cathode capacitor 134. The switch 132 is subsequently opened and the cathode capacitor 134 discharges as the photo diode sensor 136 connected to the cathode capacitor 134 conducts charge. The rate in which the cathode capacitor 134 discharges is dependent upon the intensity of light received by the photo diode sensor 136 connected to the cathode capacitor 134. Therefore, the intensity of light received by the photo diode sensor 136 can be determined by sampling the voltage on the cathode capacitor 134 a period of time after the switch 132 has been opened.

The charge conducted by a reverse biased diode is generated in a space charge region and neutral region of the diode. Photo diode sensors are configured so that the charge conducted by a reverse biased photo diode sensor is generated in the space charged region. The magnitude of the charge conducted is directly dependent on the volume of the space charged region. In an array of photo diode sensors, the space charged region of each photo diode sensor extends beyond the physical boundaries of the photo diode sensor. The space charged region is defined by the electric field between the anode and the cathode of the photo diode sensor.

Figure 3:
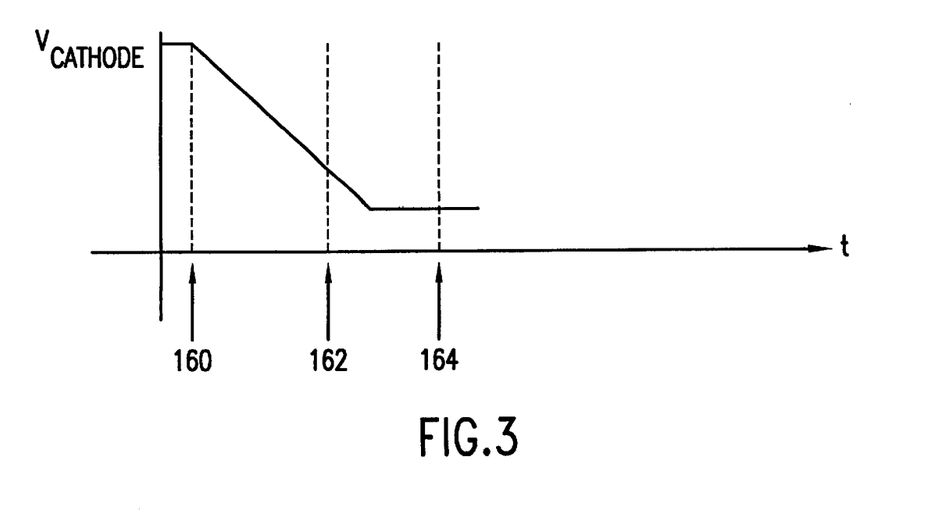
FIG. 3 shows a plot of a cathode voltage of each of the photo diode sensors while receiving light.

FIG. 3 is a plot which approximately represents the cathode voltage of each of the photo diode sensors 136 which are driven by an electronic circuit similar to the circuit shown in FIG. 2. The switch 132 of the circuit is opened at time 160. The cathode voltage of each photo diode sensor then decreases as the cathode capacitor 134 discharges as the photo diode sensor 136 connected to the cathode capacitor 134 conducts charge. The cathode voltage is sampled at time 162. The greater the intensity of received light, the lower the cathode voltage is at the time 162 that the cathode voltage is sampled. The cathode voltage stops decreasing at time 164 because the photo diode sensor has saturated.

If the intensity of the light received by the photo diode sensors 136 is too great, the photo diode sensors will saturate. That is, the cathode capacitor 134 will fully discharge before the cathode voltage is sampled. Saturation of the photo diode sensors can be avoided by either limiting the intensity of the received light or limiting the time the photo diode sensors are allowed to conduct charge due to exposure to light.

When the photo diode sensors saturate, the sensors no longer collect charge, and the electric fields across the photo diode sensors collapse. When the electric fields across the sensor collapse, charge is collected or trapped in defects within the I-layer of the sensors. The charge collected within the defects of the I-layer can cause the photo diode sensors to suffer from image lag.

Image lag generally occurs when photo diode sensors sense a series of progressive images. That is, the photo diode sensors detect several images, one after another. For example, an array of photo diode sensor can used to generate a video stream of images. Image lag occurs when an image being sensed affects an image sensed in the future. The future image is typically the next subsequent image.

Upon detection of a "next image" the charge collected within the defects will be released. The effect is that the inherent capacitance of the photo diode sensor discharges more quickly than the capacitance of the photo diode sensor would have discharged had charge not been collected within the defects. That is, the charge collected within the defects affects the sensing of the next subsequent image, causing image lag.

It is desirable to have an active pixel sensor array formed adjacent to a substrate which can detect a series of images without suffering from as much image lag as prior art active pixel sensor arrays. It is desirable that the active pixel sensor array include a structure which does not require extra formation processing steps.

SUMMARY OF THE INVENTION

The present invention is an elevated active pixel sensor array formed adjacent to a substrate in which the active pixel sensors are surrounded by guard rings. The guard rings are biased to a voltage potential which reduces the image lag of the active pixel sensor array when detecting a series of images. The active pixel sensor array does not require extra formation processing steps.

A first embodiment of this invention includes an array of active pixel sensors. The array of active pixel sensors includes a substrate that includes electronic circuitry. An interconnect structure is formed adjacent to the substrate. The interconnect structure includes a plurality of conductive vias. A plurality of conductive guard rings are formed adjacent to the interconnect structure. Each conductive guard ring is electrically connected to the electronic circuitry through at least one of the conductive vias. A plurality of photo diode sensors are formed adjacent to the interconnect structure. Each photo diode sensor is surrounded by at least one of the conductive guard rings. Each photo diode sensor includes a pixel electrode. The pixel electrode is electrically connected to the substrate through a corresponding conductive via. An I-layer is formed adjacent to the pixel electrode. The array of active pixel sensors further includes a transparent conductive layer formed adjacent to the photo diode sensors. An inner surface of the conductive layer is physically connected to the photo diode sensors, and electrically connected to the substrate through a conductive via. The electronic circuitry biases the photo diode sensors and controls a guard voltage potential of the conductive guard rings.

A second embodiment of this invention is similar to the first embodiment. The second embodiment includes the pixel electrode consisting of an N-layer.

A third embodiment of this invention is similar to the second embodiment. The third embodiment includes the I-layer and the pixel electrodes each being formed from amorphous silicon.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in an elevated active pixel sensor array formed adjacent to a substrate in which the active pixel sensors are surrounded by guard rings. The guard rings are biased to a voltage potential which reduces the image lag of the active pixel sensor array when detecting a series of images. The active pixel sensor array does not require extra formation processing steps.

Figure 4:
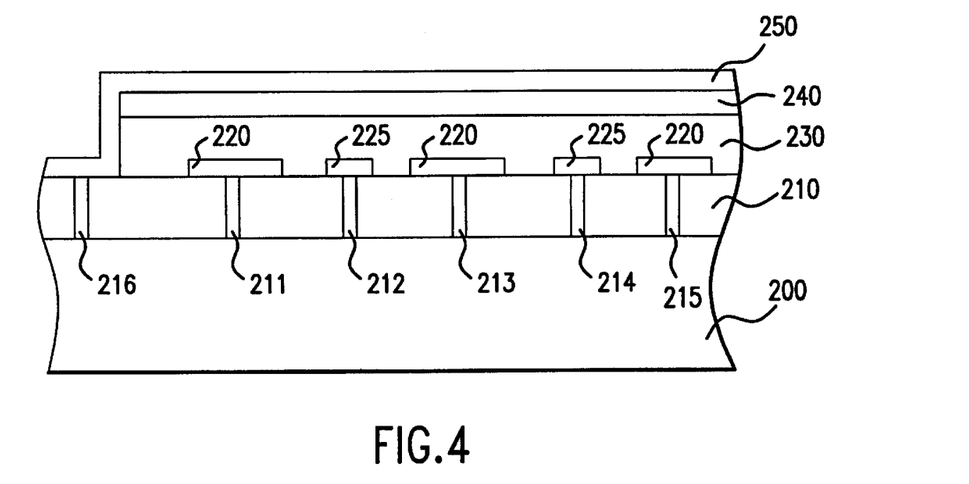
FIG. 4 shows an embodiment of the invention.

FIG. 4 shows a first embodiment of the invention. This embodiment includes a substrate 200 including electronic circuitry. An interconnect structure 210 is formed adjacent to the substrate 200. The interconnect structure 210 includes a plurality of conductive vias 211, 212, 213, 214, 215, 216. A plurality of conductive guard rings 225 are formed adjacent to the interconnect structure 210. Each guard ring 225 is electrically connected to the substrate 200 through at least one of the conductive ring vias 223, 227. A plurality of photo diode sensors are formed adjacent to the interconnect structure 210. Each photo diode sensor is surrounded by at least one of the conductive guard rings 225. Each photo diode sensor includes a pixel electrode 220 that is electrically connected to the substrate through a corresponding conductive pixel via 211, 213, 215. An I-layer 230 is formed adjacent to the pixel electrodes 220 and the conductive guard rings 225. A P-layer 240 is formed adjacent to the I-layer 230 The array of active pixel sensors further includes a transparent conductive layer 250 formed adjacent to the photo diode sensors. An inner surface of the conductive layer 250 is electrically and physically connected to the photo diode sensors, and electrically connected to the substrate through a conductive bias via 216. The electronic circuitry biases the photo diode sensors and controls a guard voltage potential of the conductive guard rings 225.

As previously mentioned, when the photo diode sensors saturate, the sensors no longer conduct charge. When saturated, the electric fields across the prior art photo diode sensors collapse. Generally, when the electric fields across the sensors collapse, charge is collected or trapped in defects within the I-layer 230 of the sensors. The charge collected within the defects of the I-layer 230 can cause the prior art photo diode sensors to suffer from image lag.

Image lag generally occurs when using photo diode sensors to sense a series of progressive images. That is, the photo diode sensors are used to detect several images, one after another. Image lag occurs when an image being sensed is effected by an image sensed in the past. The past image is typically the image detected just prior to the present image.

Upon detection of a "next image" the charge collected within the defects is released. The result is that the inherent capacitance of the photo diode sensor discharges more quickly than the capacitance of the photo diode sensor would have discharged had charge not been collection within the defects of the I-layer 230. That is, the charge collected within the defects effects the sensing of the next subsequent image, causing image lag.

The fixed guard voltage potential of the guard rings 225 provide an external electric field.

The external electric field prevents charge from ever being stored within the defects of the I-layer 230. As a result, image lag of the photo diode sensors is reduced. The biased guard rings 225 drain extra photo current away and reduce the image lag of the photo diode sensors. The fixed guard voltage potential is generally determined experimentally. The optimal value of the fixed guard voltage potential minimizes the observable image lag. The fixed guard voltage potential is typically between zero volts and 2Vdd volts where Vdd is a power supply voltage of the electronic circuitry of the substrate.

Figure 5:
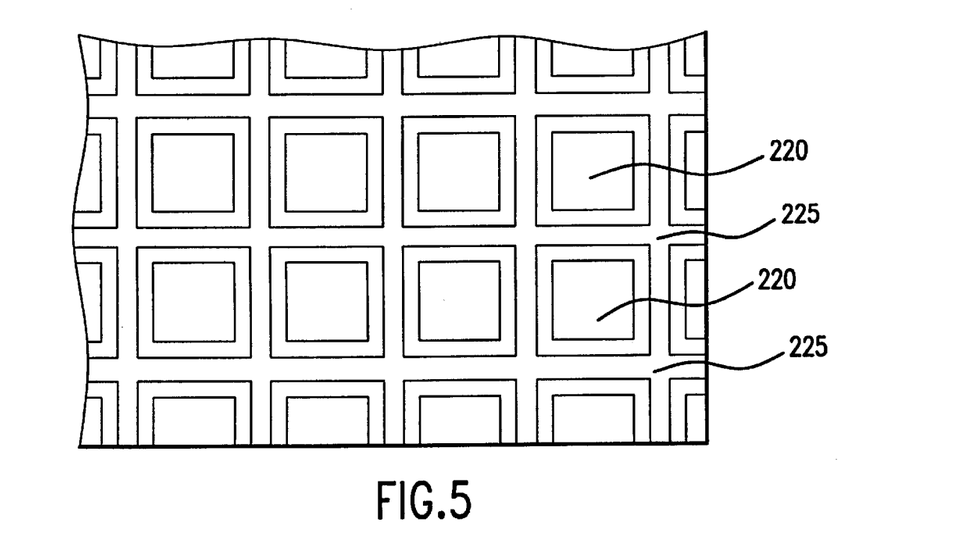
FIG. 5 shows a top view of the embodiment shown in FIG. 4.

FIG. 5 shows a top view of the embodiment shown in FIG. 4. FIG. 5 shows that the guard rings 225 surround the pixel electrodes 220. The guard rings 225 are formed by the same processing steps as the pixel electrodes 220. Therefore, formation of the guard rings 225 does not require any extra processing steps.

Figure 6:
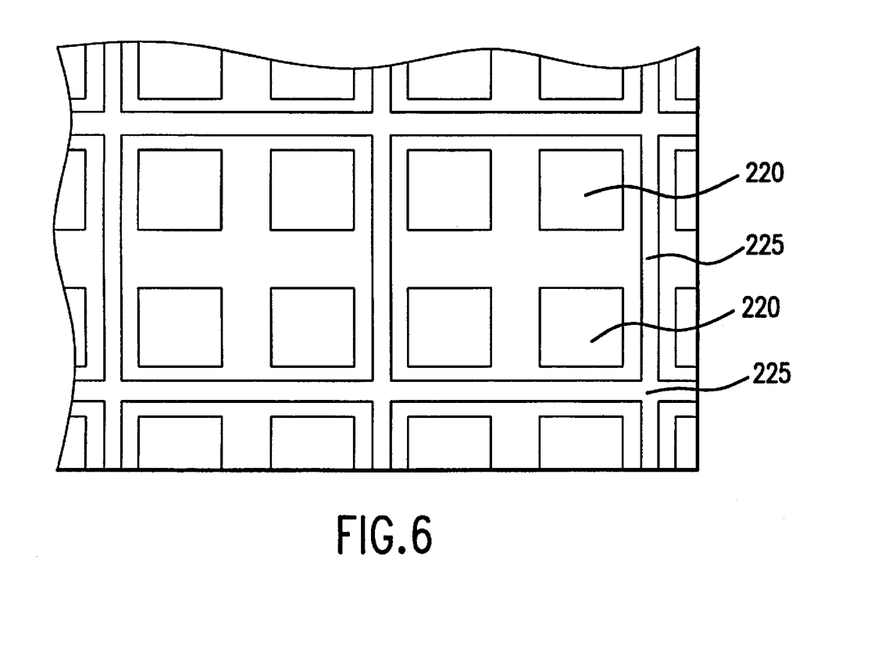
FIG. 6 shows a top view of another embodiment of the invention.

FIG. 6 shows a top view of another embodiment of the invention. FIG. 6 shows that the guard rings 225 can surround more than one pixel electrode 220.

Figure 7:
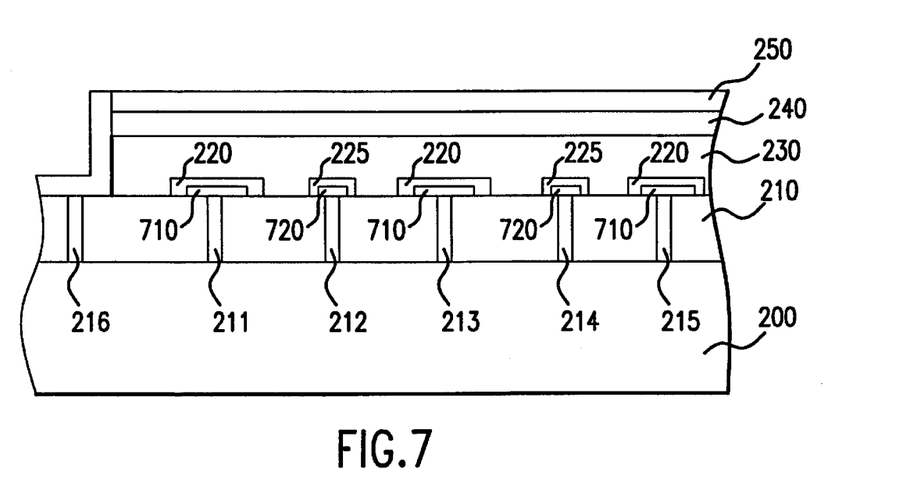
FIG. 7 shows another embodiment of the invention.

FIG. 7 shows another embodiment of the invention. This embodiment includes a pixel metallization layer 710 formed between the pixel electrodes 220 and the conductive pixel vias 211, 213, 215. This embodiment further includes a ring metallization layer 720 formed between the conductive guard rings 225 and the conductive ring vias 223, 227.

The guard rings can be spaced out amongst the photo diode sensors. The fewer the guard rings 225, the greater the image lag suffered by the array of photo diode sensors. The greater the number of guard rings 225, the less the image lag. However, more guard rings 225 reduce the "fill ratio" of an array of photo diode sensors. That is, the inclusion of the guard rings 225 reduces the number of photo diode sensors.

The pixel sensors conduct charge when the pixel sensors receive light. The substrate 200 generally includes sense circuitry and signal processing circuitry. The sense circuitry senses how much charge the pixel sensors have conducted. The amount of charge conducted represents the intensity of light received by the pixel sensors. Generally, the substrate can be CMOS (complementary metal oxide silicon), BiCMOS or Bipolar. The substrate can include various types of substrate technology including charged coupled devices.

Typically, the interconnect structure 210 is a standard CMOS interconnect structure. The structure and methods of forming this interconnect structure are well known in the field of electronic integrated circuit fabrication. The interconnect structure 210 can be a subtractive metal structure, or a single or dual damascene structure.

The inner metal section 710, 720 should include a thin conductive material. The inner metal sections 710, 720 may be formed, for example, from a degenerately doped semiconductor layer, aluminum, titanium, titanium nitride, copper or tungsten. The inner metal sections 710, 720 should be thin (approximately 500 Angstroms) and smooth. The inner metal sections 710, 720 should be smooth enough that any surface roughness is substantially less than the thickness of the pixel electrodes 220 or the conductive guard rings 225 formed over the inner metal sections 710, 720. To satisfy the smoothness requirement, polishing of the inner metal sections 710, 720 may be required.

The inner metal sections 710, 720 are optional. However, the inner metal sections 710, 720 have a lower resistance than the materials used to form the pixel electrodes 220. Therefore, the inner metal sections 710 provides better current collection.

The pixel electrodes 220 and the guard rings 225 are generally formed from a doped semiconductor. The doped semiconductor can be an N-layer of amorphous silicon. The pixel electrodes 220 must be thick enough, and doped heavily enough that the pixel electrodes 220 do not fully deplete when biased during operation. The pixel electrodes 220 and the guard rings 225 are typically doped with phosphorous.

The pixel electrodes 220 and the guard rings 225 are typically deposited using plasma etched chemical vapor deposition (PECVD). The PECVD is performed with a phosphorous, containing gas. The phosphorous gas can be $PH_3$. A silicon containing gas is included when forming amorphous silicon pixel electrodes.

An N-layer of amorphous silicon is typically used when forming PIN diode active pixel sensors. However, the diode active pixel sensors can include an NIP sensor configuration. In this case, the pixel electrodes 220 are formed from a P-layer, and the P-layer 240 of FIG. 2 is replaced with an N-layer.

The I-layer 230 is generally formed from a hydrogenated amorphous silicon. The I-layer 230 can be deposited using a PECVD or a reactive sputtering process. The PECVD process must include a silicon containing gas. The deposition should be at a low enough temperature that hydrogen is retained within the film. The I-layer 230 is approximately one micron thick.

The P-layer 240 is generally formed from amorphous silicon. Typically, the P-layer 240 is doped with Boron. The P-layer 240 can deposited using PECVD. The PECVD is performed with a Boron containing gas. The Boron containing gas can be $B_2H_6$. A silicon containing gas is included when forming an amorphous silicon P-layer 240. The P-layer 240 thickness must generally be controlled to ensure that the P-layer 240 does not absorb too much short wavelength (blue) light.

Another embodiment of the invention does not include a P-layer 240. The P-layer can be eliminated with proper selection of the composition of the material within the transparent conductor 50, and proper selection of the doping levels of the pixel electrodes 220. For this embodiment, the transparent conductor 50 provides a conductive connection between a top surface of the I-layer 230 of the pixel sensors and the interconnect structure 210, rather than just between an edge surface of the I-layer 230 and the interconnect structure 210.

As previously described, the pixel electrodes 220, the I-layer 230 and the P-layer 240 are generally formed from amorphous silicon. However, the pixel electrodes 220, the I-layer 230 and the P-layer 240 can also be formed from amorphous carbon, amorphous silicon carbide, amorphous germanium, or amorphous silicon-germanium. It should be understood that this list is not exhaustive.

The transparent conductor 250 provides a conductive connection between the P-layer 240 and the I-layer 230 of the pixel sensors, and the interconnect structure 210. Light must pass through the transparent conductor 250 which is received by the pixel sensors. Generally, the transparent conductor 250 is formed from an indium tin oxide. However, the transparent conductor 250 can also be formed from titanium nitride, thin silicide, or certain types of transition metal nitrides or oxides.

Both the selection of the type of material to be used within the transparent conductor 250, and the determination of the desired thickness of the transparent conductor 250, are based upon minimizing the optical reflection of light received by the pixel sensor. Minimization of the reflection of light received by the pixel sensor helps to optimize the amount of light detected by the pixel sensor.

The transparent conductor 250 can be deposited by a sputtering process. Deposition through sputtering is well known in the art of integrated circuit fabrication.

A protective layer may be formed over the transparent conductor 250. The protective layer provides mechanical protection, electrical insulation, and can provide some anti-reflective characteristics.

Figure 8:
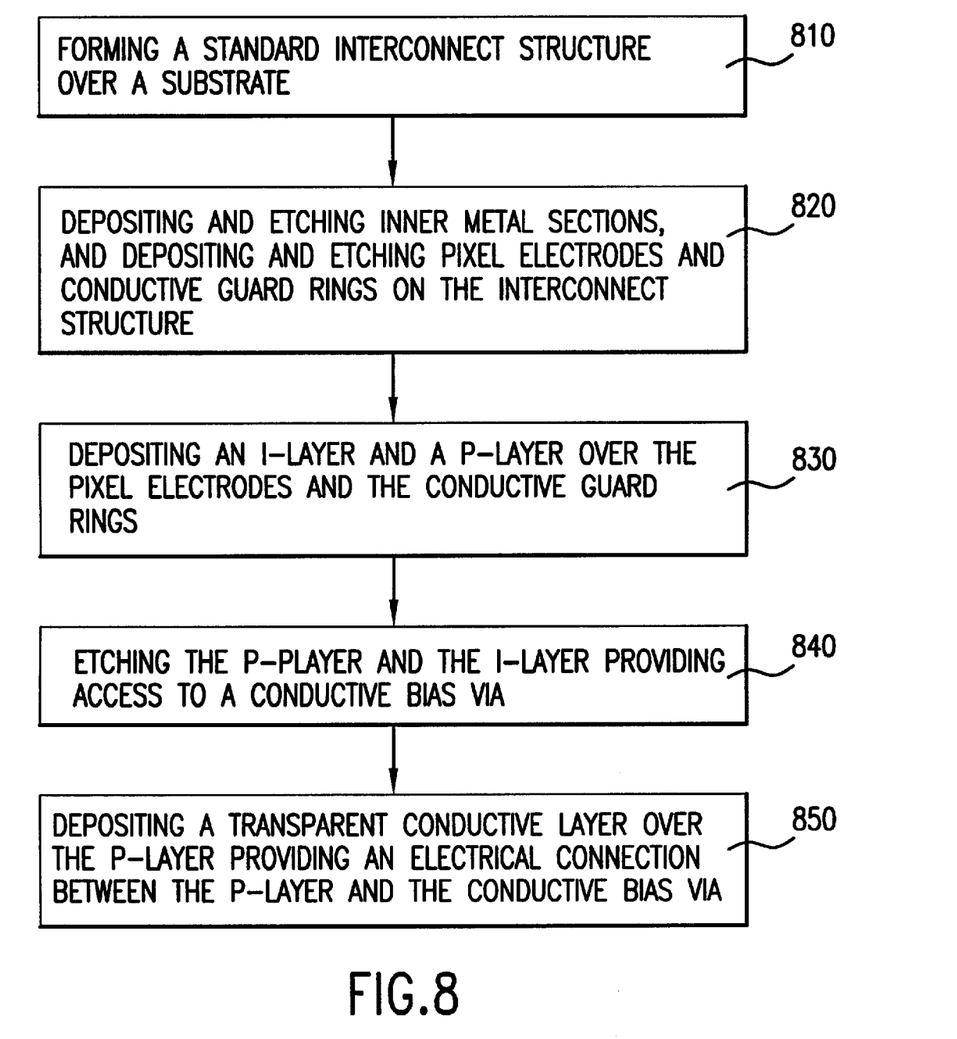
FIG. 8 is a flow chart showing steps which can be included in forming an embodiment of the invention.

FIG. 8 is a flow chart showing steps which can be included in forming an embodiment of the invention.

A first step 810 includes forming a standard interconnect structure 210 over the substrate 200. The structure and methods of forming this interconnect structure are well known in the field of electronic integrated circuit fabrication. The interconnect structure 210 can be a subtractive metal structure, or a single or dual damascene structure.

The interconnect structure 210 includes conductive vias 211, 212, 213, 214, 215, 216. Generally, the conductive vias 211, 212, 213, 214, 215, 216 are formed from tungsten. Tungsten is generally used because during fabrication, tungsten can fill high aspect ratio holes. That is, tungsten can be used to form narrow and relatively long interconnections. Typically, the conductive vias 211, 212, 213, 214, 215, 216 are formed using a chemical vapor deposition (CVD) process. Other materials which can be used to form the conductive vias 211, 212, 213, 214, 215, 216 include copper, aluminum or any other electrically conductive material.

A second step 820 includes depositing and etching the inner metal sections 710, 720, and depositing and etching the pixel electrodes 220 and conductive guard rings 225 on the interconnect structure 210. An inner metal layer is first deposited over the interconnect structure 210. The inner metal layer is then etch according to a predetermined pattern forming the inner metal section 710, 720 which correspond to the pixel electrodes 220 and the conductive guard rings 225. An electrode layer is deposited over the inner metal sections 710, 720. The electrode layer is etched according to a predetermined pattern forming the pixel electrodes 220 and the conductive guard rings 225 over the inner metal section 710, 720. An individual pixel electrode 220 and inner metal section 710 are formed for each pixel sensor.

The pixel electrodes 220 and the conductive guard rings 225 can be formed with N-layer sections. Alternatively, the pixel electrodes 220 and the conductive guard rings 225 can be formed with a conductive nitride, like, titanium nitride.

The pixel electrodes 220 and the conductive guard rings are typically deposited using PECVD. The PECVD is performed with a phosphorous containing gas. The phosphorous containing gas can be $PH_3$. A silicon containing gas, such as $Si_2H_6$ or $SiH_4$, is included when forming amorphous silicon pixel electrodes 220 and conductive guard rings 225. The predetermined pixel electrode pattern is formed through a wet or dry etch of the deposited pixel electrode material.

A third step 830 includes depositing an I-layer 230 and a P-layer 240 over the pixel electrodes 220 and the conductive guard rings 225. The I-layer 230 is generally deposited using a PECVD or reactive sputtering process. The PECVD must include a silicon containing gas. The deposition should be at a low enough temperature that hydrogen is retained within the film. The P-layer 240 can also be deposited using PECVD. The PECVD is performed with a Boron containing gas. The Boron containing gas can be $B_2H_6$. A silicon containing gas is included when forming an amorphous silicon P-layer 240.

A fourth step 840 includes etching the P-layer 230 and the I-layer 220 providing access to the conductive bias via 216. The conductive bias via 216 is electrically connected to a reference voltage on the substrate 200 which is used to bias the array of pixel sensors.

A fifth step 850 includes depositing the transparent conductive layer 250 over the P-layer 240 which provides an electrical connection between the P-layer 240 and the conductive bias via 216. Generally, the transparent conductor 250 is formed from an indium tin oxide. However, the transparent conductor 250 can also be formed from titanium nitride, thin silicide, or certain types of transition metal nitrides or oxides.

The transparent conductive layer 250 is generally deposited through reactive sputtering. However, the transparent conductive layer 250 can also be grown by evaporation. If the transparent conductive layer 250 is formed from titanium nitride, then typically a CVD process or a sputtering process must be used to deposit the transparent conductive layer 250.

As stated previously, a protective layer may be formed over the transparent conductor 250. The protective layer provides mechanical protection, electrical insulation, and can provide some anti-reflective characteristics.

Although specific embodiments of the invention have been described and illustrated, the invention is not to be limited to the specific forms or arrangements of parts so described and illustrated. The invention is limited only by the claims.

What is claimed:

1. An array of active pixel sensors comprising:
   a substrate comprising electronic circuitry;
   an interconnect structure adjacent to the substrate, the interconnect structure comprising a plurality of conductive vias;
   a plurality of conductive guard rings adjacent to the interconnect structure, each guard ring electrically connected to the substrate through at least one of the conductive vias;
   a plurality of photo diode sensors adjacent to the interconnect structure, each photo diode sensor surrounded by at least one of the conductive guard rings, each photo diode sensor comprising:
      a pixel electrode, the pixel electrode electrically connected to the substrate through a corresponding conductive via;
      an I-layer formed over the pixel electrode;
   the array of active pixel sensors further comprising:
   a transparent conductive layer formed adjacent to the photo diode sensors, an inner surface of the conductive layer physically connected to the photo diode sensors, and electrically connected to the substrate through a conductive via; wherein
   the electronic circuitry biases the photo diode sensors and controls a guard voltage potential of the conductive guard rings.

2. The active pixel sensor as recited in claim 1, wherein each conductive guard ring comprises:
   a guard ring electrode layer.

3. The active pixel sensor as recited in claim 1, wherein each conductive guard ring comprises:
   a guard ring metallic layer.

4. The active pixel sensor as recited in claim 1, wherein each pixel electrode comprises an electrode metallic layer.

5. The active pixel sensor as recited in claim 1, wherein the interconnect structure electrically interconnects the pixel electrodes to the substrate.

6. The photo diode active pixel sensor as recited in claim 5, wherein the P-layer comprises amorphous silicon.

7. The photo diode active pixel sensor as recited in claim 1, wherein the I-layer and the pixel electrodes each comprise amorphous silicon.

8. The photo diode active pixel sensor as recited in claim 1, further comprising a P-layer formed between the I-layer and the conductive transparent layer, the inner surface of the conductive transparent layer physically connected to the P-layer, the I-layer, and electrically connected to the substrate through a conductive via.

9. The photo diode active pixel sensor as recited in claim 1, wherein the inner surface of the conductive transparent layer is electrically connected to the substrate through a tungsten plug.

10. The photo diode active pixel sensor as recited in claim 1, wherein the conductive transparent layer comprises indium tin oxide.

11. The photo diode active pixel sensor as recited in claim 1, wherein the substrate comprises CMOS.

12. The photo diode active pixel sensor as recited in claim 1, wherein the substrate comprises active circuits which sense charge accumulated by the photo diode sensors due to the photo diode sensors receiving light.

13. The photo diode active pixel sensor as recited in claim 1, wherein the substrate comprises charge coupled devices.

14. The photo diode active pixel sensor as recited in claim 1, wherein the inner surface of the conductive transparent layer is electrically connected to the substrate through a plurality of tungsten plugs.

15. The active pixel sensor as recited in claim 1, wherein each pixel electrode comprise a P-layer.

* * * * *